United States Patent
Wang et al.

(10) Patent No.: US 7,850,321 B2
(45) Date of Patent: Dec. 14, 2010

(54) WAVELENGTH CONVERTING SYSTEM

(75) Inventors: Chien-Yuan Wang, Hsinchu (TW); Min-Hsun Hsieh, Hsinchu (TW); Chih-Chiang Lu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 156 days.

(21) Appl. No.: 12/219,084

(22) Filed: Jul. 16, 2008

(65) Prior Publication Data
US 2009/0021926 A1    Jan. 22, 2009

(30) Foreign Application Priority Data
Jul. 18, 2007  (TW) .............................. 96126269 A

(51) Int. Cl.
*F21V 9/16* (2006.01)
(52) U.S. Cl. ........................ 362/84; 362/231
(58) Field of Classification Search .................. 362/84, 362/231, 235, 260, 800
See application file for complete search history.

(56) References Cited

U.S. PATENT DOCUMENTS

| | | |
|---|---|---|
| 7,038,370 B2 | 5/2006 | Mueller-Mach et al. |
| 2005/0099808 A1 * | 5/2005 | Cheng et al. ................. 362/231 |
| 2008/0308822 A1 * | 12/2008 | Tsang et al. ................... 257/89 |
| 2009/0180273 A1 * | 7/2009 | Kim et al. ...................... 362/84 |

FOREIGN PATENT DOCUMENTS

CN    1761835 A    4/2006

OTHER PUBLICATIONS

Office Action dated Jul. 9, 2010 in corresponding Chinese application No. 200710138138.8.

* cited by examiner

*Primary Examiner*—David V Bruce
(74) *Attorney, Agent, or Firm*—Bacon & Thomas, PLLC

(57) ABSTRACT

An embodiment of the invention discloses a wavelength converting system capable of emitting a second electromagnetic radiation having a second wavelength in response to a first electromagnetic radiation having a first wavelength, wherein an energy level of the first electromagnetic radiation is higher than that of the second electromagnetic level, and a positive correlation is between the first wavelength and the second wavelength.

21 Claims, 7 Drawing Sheets

WAVELENGTH CONVERTING SYSTEM

TECHNICAL FIELD

The invention relates to a wavelength converting system and a method of making the same, and more particularly to a wavelength converting system capable of generating a wavelength spectrum having a stable color temperature in response to a change of the excitation wavelength.

REFERENCE TO RELATED APPLICATION

This application claims the right of priority based on TW application Ser. No. 096126269, filed Jul. 18, 2007, and the content of which is hereby incorporated by reference.

DESCRIPTION OF BACKGROUND ART

Light-emitting diode (LED) is known by its high energy efficiency and so introduced to the energy-saving movement in many kinds of equipments of variable fields including outdoor lighting, means of transportation, and household lighting, such as street light, traffic light, outdoor display, headlamp, trail light, center high mounted stop lamps (CHMSL), and decoration light.

A basic structure of a light-emitting diode chip mainly includes a p-n junction. The hole of the p-type semiconductor material and the electron of the n-type semiconductor recombine to emit light under a bias voltage. The light-emitting area in the structure is sometimes called "active layer" or "light-emitting layer". The wavelength from the light-emitting layer is determined by the adopted material. The structure emitting red light is constructed by introducing a main material such as GaP, GaAsP, AlGaAs, and AlGaInP. The structure emitting green light is constructed by introducing a main material such GaP and ZnCdSe. The structure emitting blue light is constructed by introducing a main material such as SiC and GaN. Those different materials are usually grown on different substrates such as GaP, GaAs, SiC, and sapphire.

The available light-emitting diode chip in market emits not only white light but also variable color lights of almost the whole range of the visible wavelength (400 nm~750 nm) and ultraviolet. White light can be generated in several ways such as by mixing lights from blue, green, and red chips, exciting phosphor by UV light, exciting phosphor by blue light, using semiconductor wavelength converting material (also called "photo-recycling semiconductor LED"; PRS LED), and dye. The most common commercial way of generating white light makes yttrium aluminum garnet (YAG) phosphor be pumped by blue light to generate a complementary color. For example, a 460 nm blue chip is introduced to excite YAG:Ce phosphor to generate a 570 nm around yellow light, one may control the concentration and the thickness of the phosphor to adjust the ratio of blue light to yellow light in order to produce white lights having various color temperatures.

Phosphor absorbs shorter wavelengths to emit longer wavelengths, that is, absorbs a high energy level radiation to emit a low energy level radiation. A phosphor is characterized by its excitation band and emission band. The excitation band has a primary wavelength distribution shorter than that of the emission band, while the two bands may overlap in part. The peak wavelength difference of the absorption band and the emission wavelength is called "Stokes shift". The phosphor may be caused to radiate in a similar emission spectrum by any wavelength within the excitation band. However, the phosphor is operated at different efficiencies responsive to different absorbed wavelengths, which depends on the composition of phosphor.

In another aspect, the numerous chips on a wafer appear to be in a non-uniform wavelength distribution spanning from 10 nm to 20 nm or more. Provided a specific recipe of phosphor is introduced to directly or indirectly overlay on or be packaged with all chips, the color temperature of the white light from the end product is divergent so significantly that the qualitative uniformity of the application product is affected.

As shown in FIG. 1A, LED light source 12 emits blue lights 11 and 13 at specific wavelengths. The blue light 13 excites phosphor 14 to generate yellow light 15. The blue light 11 and the yellow light 15 are mixed into white light 17. The yellow light 15 is going to remain in the same spectrum even if the wavelength of the blue light from the LED light source 12 is changed but still within the excitation band of the phosphor 14. The wavelength difference of the blue light therefore results in a shift of the color temperature of the mixed white light 17.

In addition, a CIE chromaticity diagram is shown in FIG. 1B. A 460 nm blue light and a 571 nm yellow light generated by exciting YAG phosphor at a fixed condition are mixed into a white light of about 6000K color temperature. However, if the blue light wavelength shifts up to 470 nm or down to 450 nm, while the yellow light is unchanged, the color temperature of the mixed white light also shifts to 10000K or 5000K, which is usually unacceptable to common applications. To produce color lights having constant color temperatures, therefore, the chips are necessarily undergone sorting and binning processes before a condition- or characteristic-specific phosphor is applied to.

SUMMARY OF THE DISCLOSURE

A wavelength converting system in accordance with one embodiment of present invention includes a wavelength converter responsive to an illumination by a first electromagnetic radiation having a first wavelength and providing a second electromagnetic radiation having a second wavelength in a positive correlation to the first wavelength, and the first electromagnetic radiation having a higher energy level than the second electromagnetic radiation.

In several preferable embodiments, the first wavelength is in a range of 200 nm~530 nm; the second wavelength is in a range of 480 nm~700 nm; the wavelength converter includes an yttrium aluminum garnet phosphor and a silicate phosphor.

A wavelength converting system in accordance with another embodiment of present invention includes a first excitation wavelength emitted from a first light emitter; a first emission wavelength greater than the first excitation wavelength; a second excitation wavelength emitted from a second light emitter; and a second emission wavelength greater than the second excitation wavelength; wherein each of the first excitation wavelength, the first emission wavelength, the second excitation wavelength, and the second emission wavelength has chromaticity coordinates locating on a perimeter of a CIE chromaticity diagram, and a first line connects the first excitation wavelength and the first emission wavelength, a second line connects the second excitation wavelength and the second emission wavelength while an intersection of the first line and the second line is within the CIE chromaticity diagram.

In several preferable embodiments, the first excitation wavelength and the second excitation wavelength are in a range of 200 nm~530 nm respectively; the first emission wavelength and the second emission wavelength are in a range of 480 nm~700 nm respectively; the intersection of the first line and the second line is in a white light region; and the first light emitter and the second light emitter are made of a material containing nitrogen. Furthermore, the first excitation wavelength and the second excitation wavelength are preferably converted to the first emission wavelength and the second emission wavelength by the same or similar wavelength converter respectively. The so-called "similar" wavelength converters have identical primary constituents; preferably, the wavelength converter includes at least an yttrium aluminum garnet phosphor and a silicate phosphor.

A wavelength converting system in accordance with further embodiment of present invention includes a radiation source; a first fluorescent material capable of being excited by the radiation source within a wavelength spectrum having a short wavelength and a long wavelength; and a second fluorescent material capable of being excited by the radiation source within the wavelength spectrum; wherein the first fluorescent material has an excitation efficiency higher than the second fluorescent material when excited by the short wavelength, and an excitation efficiency lower than the second fluorescent material when excited by the long wavelength.

In several preferable embodiments, the radiation source radiates in a wavelength range of 200 nm~530 nm; the radiation source comprises a nitride-based optoelectronic semiconductor device; the first fluorescent material includes a silicate phosphor; and the second fluorescent material includes an yttrium aluminum garnet phosphor.

A wavelength converting system in accordance with one embodiment of present invention includes two or more light sources, two of the light sources having a wavelength difference not less than 1 nm and not greater than 20 nm; and a wavelength converter positioned on light paths of the two light sources and capable of being excited by one of the two light sources to provide a first mixed light and by the other one to provide a second mixed light; wherein a color temperature difference between the first and second mixed lights is not greater than 100K.

In several preferable embodiments, at least one of the light sources includes a light-emitting diode; the light sources radiate light in a wavelength range of 200 nm~530 nm.

A wavelength converting system in accordance with one embodiment of present invention includes a light-emitting semiconductor structure comprising an electron provider, a hole provider, and a light-emitting layer between the electron provider and the hole provider; and a wavelength converter positioned on a light extraction interface of the light-emitting semiconductor structure to provide an output light in response to an excitation of an input light in a wavelength spectrum; wherein a positive correlation is between the input light and the output light. The light-emitting semiconductor structure preferably is made of a material containing nitrogen.

A wavelength converting system in accordance with one embodiment of present invention includes a light-emitting source freely selected from any one of applicable light-emitting diode units on a wafer; and a wavelength converter positioned on a light extraction interface of the light-emitting source to provide an output light in response to an input light; wherein a mixed color light is generated by the presence of the input light and the output light. The light-emitting diode unit preferably includes a nitride-based light-emitting diode.

DETAILED DESCRIPTION OF PREFERRED EMBODIMENTS

The embodiments are described hereinafter in accompany with drawings.

Figure 1A:
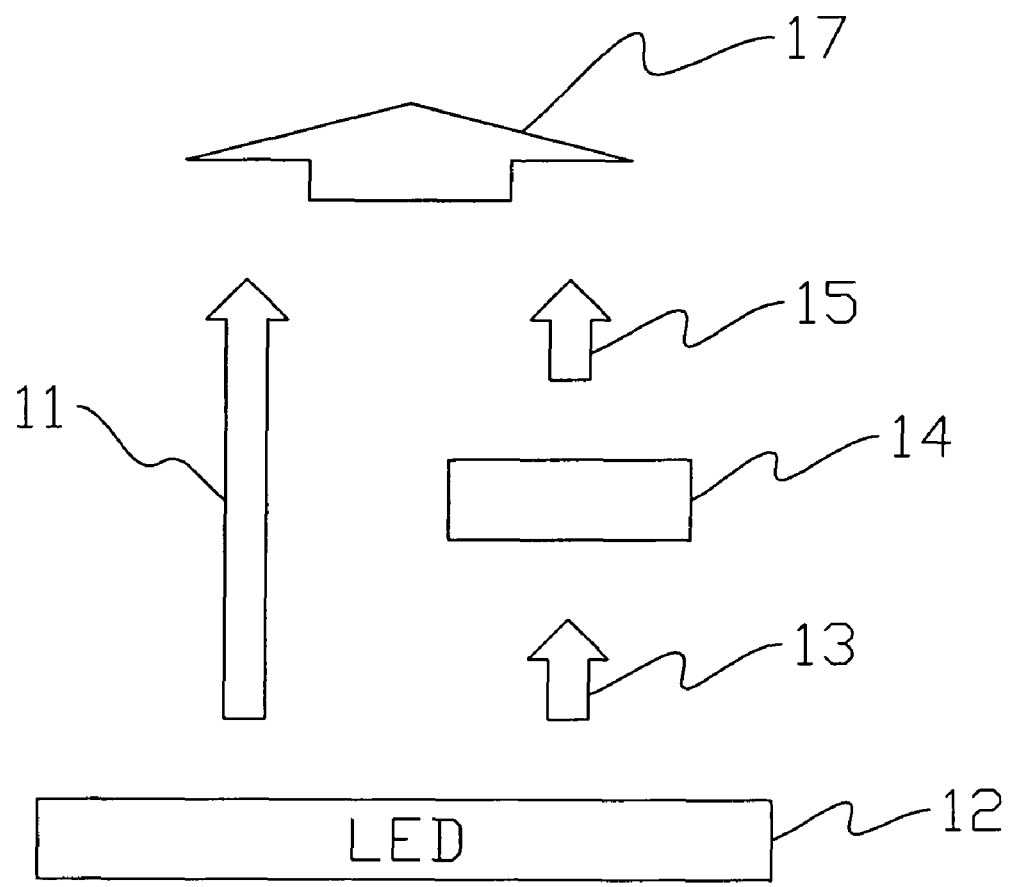
FIGS. 1A and 1B illustrate a conventional wavelength converting system and its CIE chromaticity diagram.
Figure 1B:
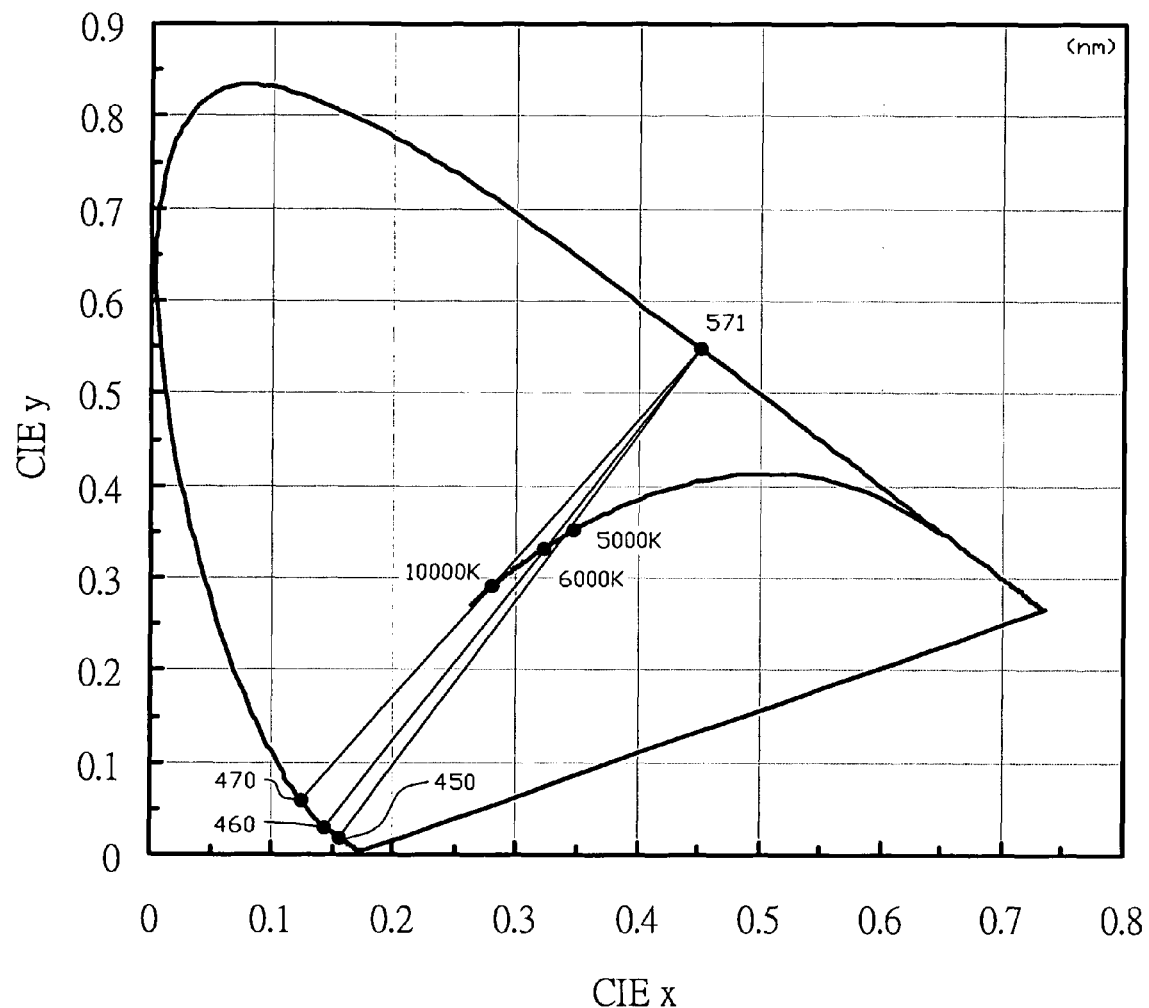
Figure 2A:
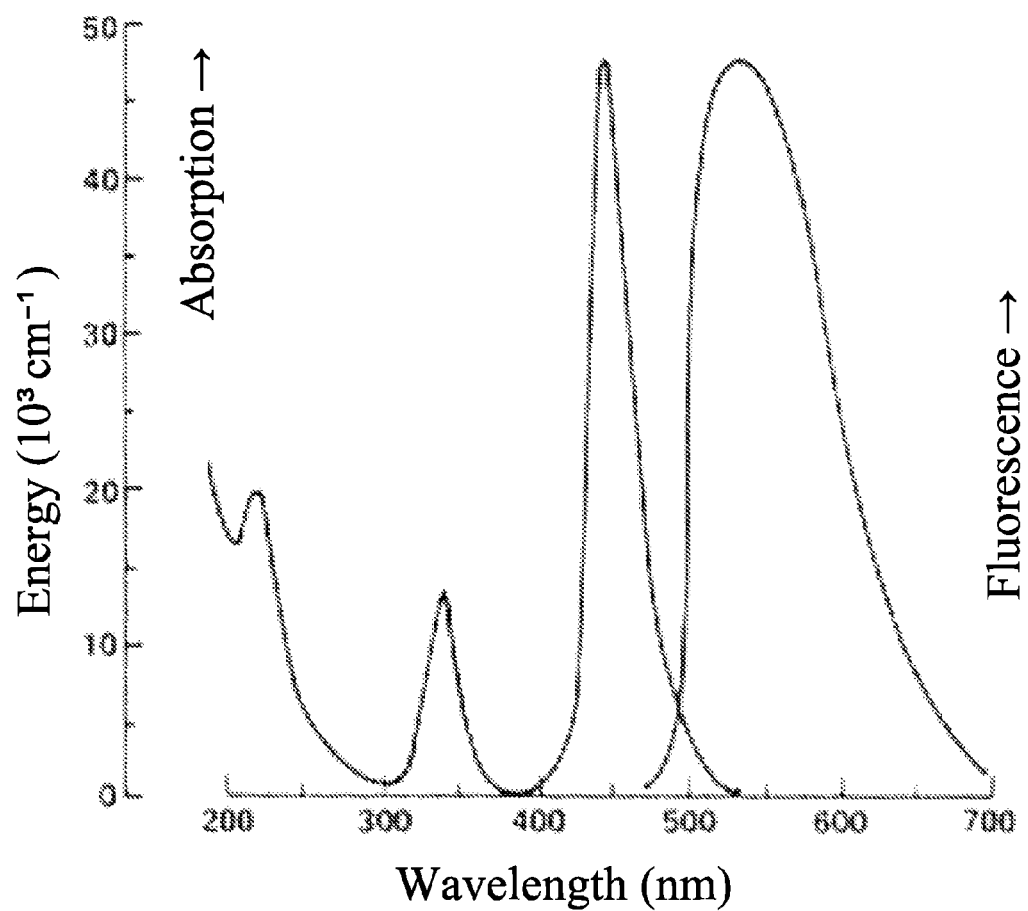
FIG. 2A illustrates an excitation and emission spectrum of a YAG phosphor in accordance with an embodiment of present invention.
Figure 2B:
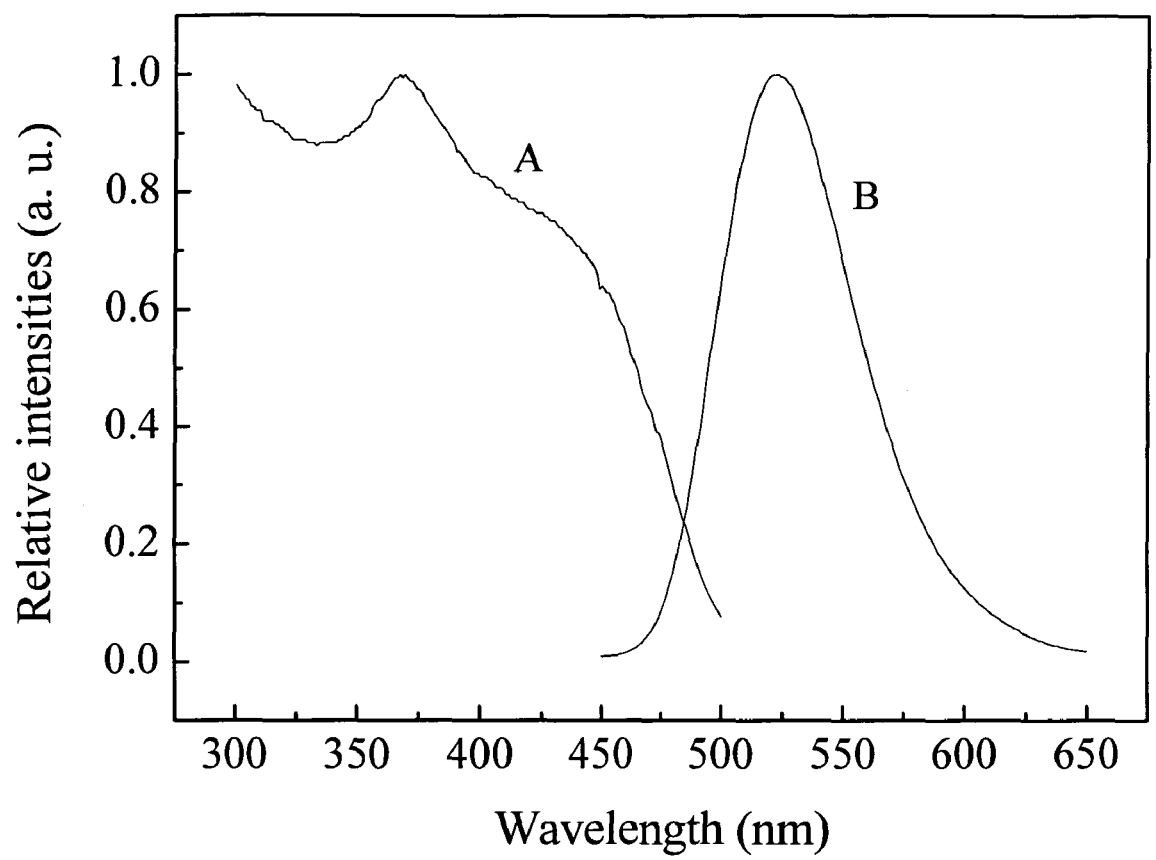
FIG. 2B illustrates an excitation and emission spectrum of a silicate phosphor in accordance with an embodiment of present invention.

In one embodiment of present invention, YAG and silicate-based phosphors are selected to blend into a mixed phosphor (hereinafter called "mixture", but the kinds and the quantities of materials are not limited by the aforementioned.) In the embodiment, FIG. 2A illustrates the spectrum of YAG phosphor, which has an excitation spectrum of a range of 200 nm~530 nm, a principle emission spectrum of a range of 480 nm~700 nm, and a peak wavelength of about 530 nm. FIG. 2B illustrates the spectrum of the silicate-based phosphor, which has an excitation spectrum in a range of 300 nm~500 nm, a principle emission spectrum of a range of 470 nm~650 nm, and a peak wavelength of about 525 nm.

As shown in FIGS. 2A and 2B, YAG phosphor has a higher efficiency at about 470 nm, while silicate-based phosphor has a higher efficiency at about 450 nm. When the excitation wavelength moving from 470 nm to 450 nm, the efficiency of YAG phosphor decreases, while the efficiency of silicate-based phosphor increases. In other words, provided the two phosphors are mixed and excited at a wavelength starting from 470 nm to 450 nm, the ratio of the shorter wavelength fluorescent light contributed by silicate-based phosphor to the total fluorescent light increases, while the ratio of the longer wavelength fluorescent light contributed by YAG phosphor to the total fluorescent light decreases. In consequence, the ratio of the emission lights from YAG and silicate-based phosphors changes with the variation of the excitation. In the embodiment, when the excitation wavelength decreasing, the wavelength spectrum of the mixed light from the mixture is slanted to the direction of the shorter wavelength, i.e. the shorter wavelength is given a higher weighting in the mixed light. The color temperature of the color light resulting from mixing the emission light of the mixture and the excitation light is kept in a constant range. On the contrary, when the excitation wavelength moving from the shorter wavelength to the longer wavelength, the fluorescent mixture according to the embodiment is able to provide an emission light shifting to longer wavelength. By means of the mixture according to the embodiment, a positive correlation is found between the emission wavelength and the excitation wavelength.

Figure 2C:
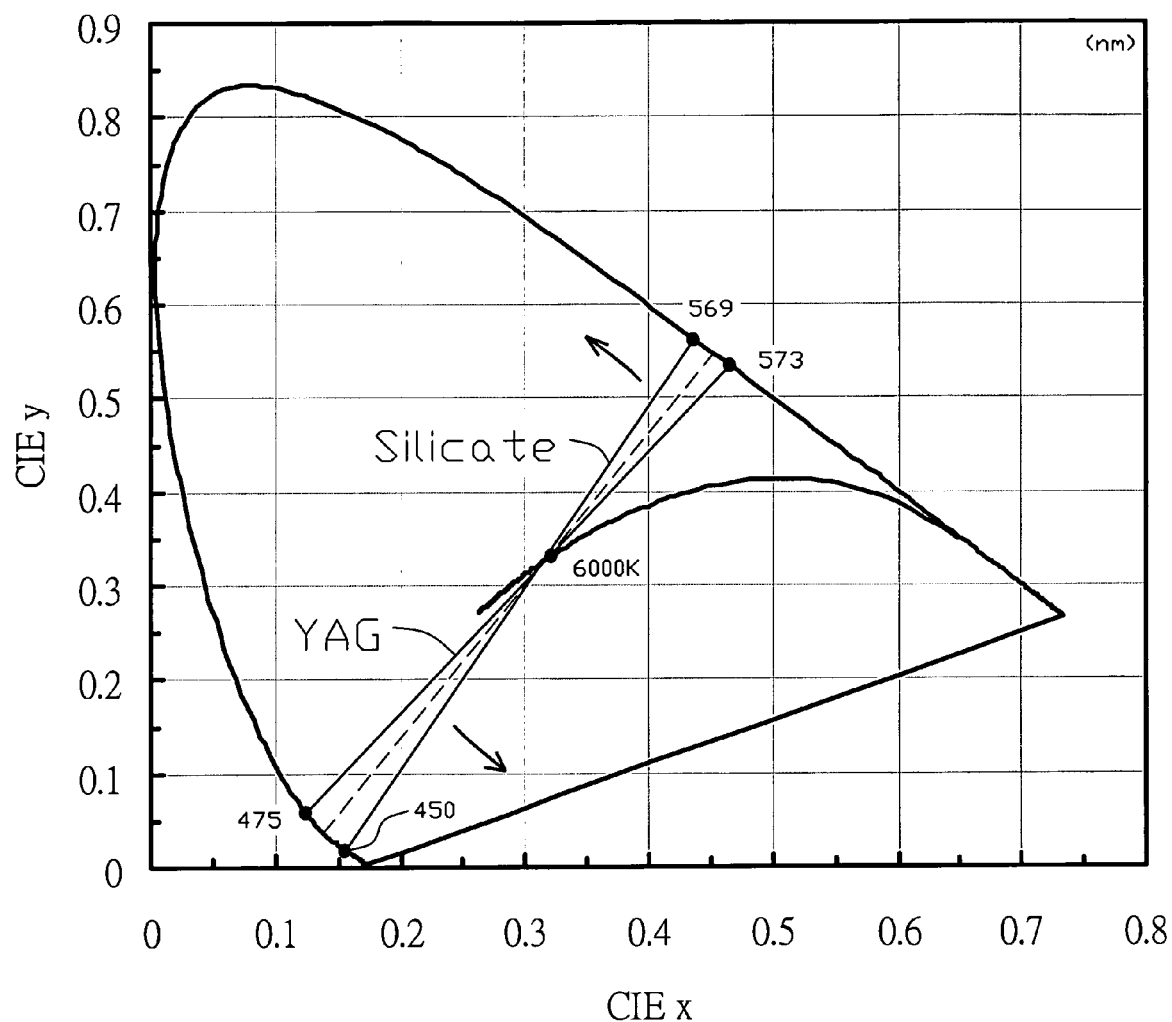
FIG. 2C illustrates a CIE chromaticity diagram of a wavelength converting system in accordance with an embodiment of present invention.

FIG. 2C shows a CIE chromaticity diagram illustrating the relationship between the excitation light and the emission light or wavelength converting system in accordance with one embodiment of the invention. The lines respectively connecting the representative excitation wavelength and the representative emission wavelength of one and the other phosphor of the mixture, or any two kinds of phosphors, are intersected in the diagram. The arc of the lower left sector of the intersection represents the wavelength range of the excitation light. The arc of the upper right sector of the intersection represents the wavelength range of the emission light from the excited phosphor. The chromaticity coordinates of the color light mixed by the emission light and the unconverted excitation light locates on or nearby the intersection on the CIE diagram. The color temperature resulted from the wavelength converting system can be restricted on the vicinity of the line intersection by a well modification of the distribution of the excitation wavelength and the phosphor ratio of the mixture. Therefore, the color light generated by the system can be kept on a relative stable color temperature. Specifically, applying the fluorescent mixture according the embodiment to blue LED chips having divergent wavelengths or spectra, one can obtains white lights with less variation by mixing the yellow light generated by exciting the mixture by the light from those chips and the raw blue light from the same.

In the diagram, the line connecting 450 nm and 569 nm illustrates the possible color light from the pure silicate-based phosphor, and the line connecting 470 nm and 573 nm illustrates the possible color light from the pure YAG phosphor. The two lines intersect at the point of the white light of around 6000 K. With a specific mixture ratio and arrangement of YAG and silicate-based phosphors, the emission light having a dominant wavelength of 569 nm~573 nm can be generated by the excitation light ranging between 450 nm and 470 nm, and mixed with the same to emit white light having a substantially constant color temperature around 6000 K.

Figure 3:
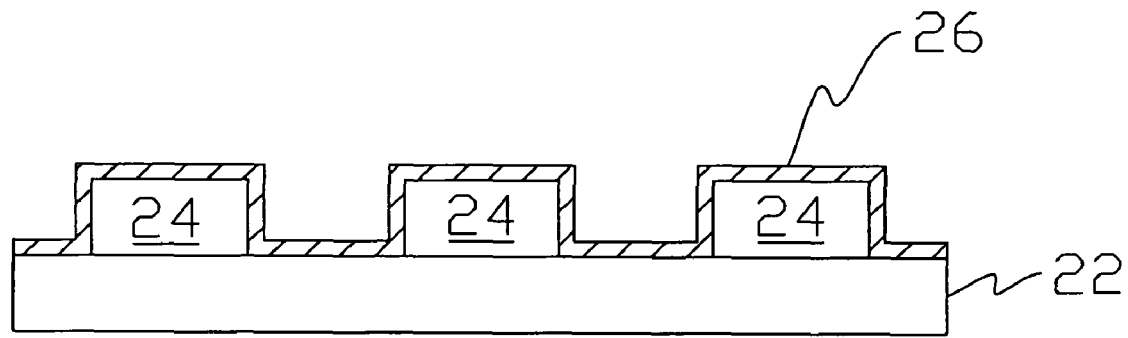
FIG. 3 illustrates a wavelength converting system in accordance with another embodiment of present invention.

As shown in FIG. 3, another embodiment of the invention discloses a carrier 22, light-emitting structures 24, and a phosphor 26 overlaying on the light-emitting structures 24, wherein the quantity of the light-emitting structures is illustrative and not used to limit the disclosure of the embodiment. The carrier 22 includes but not limited to a growth substrate and a material or a structure applicable to dispose the light-emitting structures 24. The wavelength of the light-emitting structures 24 varies in a range of few nanometers, tens of nanometers, or applicable to the phosphor 26, for example, 10 nm~20 nm. The dominant wavelength of the light-emitting structure 24 is within the visible light spectrum such as 420 nm~480 nm, or the wavelength viable to excite the phosphor 26. The light-emitting structures 24 on the carrier 22 can emit light in a wavelength distribution of Gaussian distribution or non-normal distribution. The wavelength of the emission light of the phosphor 26 moves in a tendency following the change of the wavelength of the excitation light. Even the light-emitting structures 24 have excitation wavelengths different from each other; the emission wavelength from the phosphor 26 on the light-emitting structure 24 may be spontaneously adjusted by following or tracing the shifting tendency of the excitation wavelength, or according to the alteration of the excitation wavelength. Accordingly, the impact, caused by the quality deviation such as the variation of the wavelength of the light-emitting structure 24, on the color difference of the mixed light or the perceived color light quality can be reduced. For example, using the phosphor 26 of present embodiment, the color temperature of the color light mixed by the excitation light of the light-emitting structure 24 and the emission light of the phosphor 26 can be kept in a fixed range. The range is determined by the kinds of phosphors, the user's requiring specification, and/or the application environment.

In the drawings, the arrangement of overlaying the phosphor 26 is only an illustration of the embodiment. Any kinds of methods can apparently be used to dispose the phosphor 26 on the light-emitting structure 24, such as partial coverage, uniform thickness, varying thickness, upper side coverage, and lateral direction coverage. In one case, the light-emitting structure 24 is grown on a growth substrate and covered by the phosphor 26. In another case, the light-emitting structure 24 is separated from a growth substrate, mounted on the carrier 22, and then covered by the phosphor 26. Taiwan granted patent No. I241728 and U.S. patent application Ser. No. 11/160,588 owned by the same applicant are hereby incorporated by reference. In further case, the light-emitting structure 24 is a light-emitting diode chip or package, and the carrier 22 is a circuit board. In addition, the light-emitting structure 24 can be arranged on the carrier 22 in a flip-chip arrangement and then covered by the phosphor 26. In a preferable case, the phosphor 26 overlays on a light-pervious substrate or a light-pervious optical element. The light-emitting structure 24 preferably emits light in a range of 400 nm~500 nm. The color light mixed by the excitation light of the light-emitting structure 24 and the emission light of the phosphor 26 includes but not limited to white light and other visible light.

Figure 4:
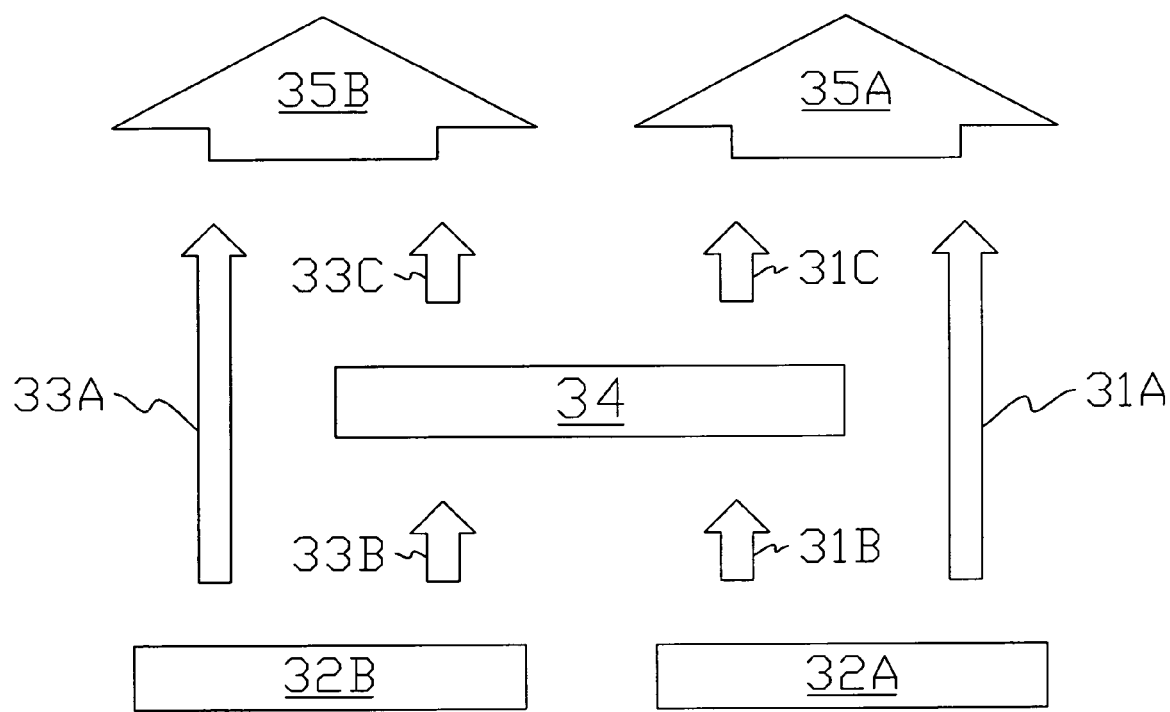
FIG. 4 illustrates a wavelength converting system in accordance with further embodiment of present invention.

As shown in FIG. 4, in accordance with another embodiment of the invention, a wavelength converting system 30 includes a first light source 32A, a second light source 32B, and a wavelength converter 34 The first light source 32A and the second light source 32B are able to emit light rays which show perceivable difference in wavelength, spectrum, or intensity. For example, the perceivable difference is a wavelength difference or spectrum shift in a range of 1 nm~20 nm or so. The wavelength converter 34 includes at least one material having a composition able to be excited by the first light source 32A and the second light source 32B, and emitting light in response to a changing tendency of the excitation light in a specific spectrum, or in a positive correlation with the excitation light.

The wavelength converter 34 is excited by light 31B from the first light source 32A to generate emission light 31C. The unconverted light 31A from the first light source 32A and the light 31B are mixed to mixed light 35A. The wavelength converter 34 is excited by light 33B from the second light source 32B to generate emission light 33C. The unconverted light 33A from the second light source 32B and the light 33C are mixed to mixed light 35B. The mixed lights 35A and 35B have similar color temperature, for example, the mixed lights 35A and 35B have a color temperature difference less than 100K, or a number below that an user is not easily aware of such difference, or similar chromaticity coordinates. Using the wavelength converter 34 in accordance with present embodiment, the system 30 can generate uniform or similar color lights, such as the mixed lights 35A and 35B, even though there exists a perceivable wavelength difference between light sources such as light sources 32A and 32B.

In present embodiment, the wavelength converter 34 may directly contact with the light sources 32A and 32b, for example, a package, including more light-emitting diode chips, is packaged by a material having a fluorescent mixture showing a positive correlation between the excitation wavelength and the emission wavelength. The wavelength converter 34 may also be separated from the light sources 32A and 32B, for example, a luminous device includes more light sources and a light-pervious optical element which is a kind of covering means such as a lampshade, a tube, a lens, a cover, a sticker, a plate, and a film, and covered by, coupled to, or mixed with the wavelength converter 34 positioned on the light path of the light source and used to convert the original wavelength of the light source. In addition, the wavelength converter 34 can be optionally formed on a reflective inner surface of the luminous device, and used to convert the light coming from the light source and then reflected by the inner surface, or being reflected to transmit the wavelength converter 34

Table 1 shows an experimental result obtained by implementing an embodiment of the invention. Two 15 mil×15 mil nitride-series light-emitting diode chips are operated under controllable current and positioned adjacent to each other in a package equipped with a silver reflector. Among the two chips, one has a dominant wavelength of 450 nm, and the other one has a dominant wavelength of 470 nm. The silicate-based phosphor and YAG phosphor in a weight ratio of about 1.08 (0.26 g/0.24 g) are mixed with epoxy and disposed on the two light-emitting diode chips. The input currents to the respective two light-emitting diode chips are controlled to oppositely change in a range between 0 mA~20 mA, i.e. the current inputted into one chip arises while the current inputted into the other chip drops. The wavelength spectrum of the mixed light resulted from the two chips can be changed by adjusting the currents into the chips. The configuration of the experiment is used to simulate the wavelength distribution of blue light ranged in 450 nm~470 nm. In one experimental case, the input current is set to levels of 0 mA, 5 mA, 10 mA, 15 mA, and 20 mA. One can observe that the correlated color temperature (CCT) of the resulted mixed light can be kept within 5945K~6035K, wherein the difference is less than 100K, even though the input currents of the two chips change. In other words, the fluorescent mixture in accordance with the embodiment of the invention has a higher tolerance to the difference of the intensity and the wavelength of the light sources such that the system can achieve a relative steady luminous quality.

Using the wavelength converter in accordance with an embodiment of the invention, a user can have an opportunity to freely adopt any one chip from a single wafer. In other words, even there exists an emitting wavelength difference between the light-emitting diode chips on the single wafer, those chips, provided well functioning, can potentially be used in downstream products without further binning and sorting. Furthermore, using the wavelength converter in accordance with an embodiment of the invention, even though the light sources arranged in the wavelength converting system have divergent wavelength distributions, the color temperature resulted from the system is only slightly influenced by those property-divergent light sources.

Besides YAG and silicate-based phosphors adoptable in the embodiment of the invention, the material of the phosphor excitable to emit yellow light includes but not limited to Terbium Aluminum Garnet (TAG) which has an exemplary composition of $Tb_3Al_5O_{12}$:Ce and oxynitride which has an exemplary composition of $(SrBa)Si_2N_2O_2$:Eu.

The foregoing description has been directed to the specific embodiments of this invention. It will be apparent; however, that other variations and modifications may be made to the embodiments without escaping the spirit and scope of the invention.

TABLE 1

| Silicate/YAG = 0.26/0.24 (g/g) | | | | | | |
|---|---|---|---|---|---|---|
| If (mA) | | | | | | CCT |
| 450 (nm) | 470 (nm) | P (mW) | Iv (lm) | CIEx | CIEy | (K) |
| 0 | 20 | 9.531 | 3.161 | 0.3176 | 0.3875 | 6023 |
| 5 | 15 | 10.200 | 3.388 | 0.3182 | 0.3755 | 6035 |
| 10 | 10 | 10.500 | 3.472 | 0.3192 | 0.3659 | 6021 |
| 15 | 5 | 10.400 | 3.425 | 0.3201 | 0.3556 | 6018 |
| 20 | 0 | 9.729 | 3.220 | 0.3226 | 0.3431 | 5945 |

What is claimed is:

1. A wavelength converting system comprising:
   a wavelength converter, responsive to an illumination by a first electromagnetic radiation having a first wavelength, and providing a second electromagnetic radiation having a second dominant wavelength, wherein the first electromagnetic radiation has a higher energy level than the second electromagnetic radiation, and the first wavelength and the second dominant wavelength have a positive correlation.

2. The wavelength converting system of claim 1, wherein the first wavelength is in a range of 200 nm.about.530 nm, and the second dominant wavelength is in a range of 480 nm.about.700 nm.

3. The wavelength converting system of claim 1, wherein the wavelength converter comprises an yttrium aluminum garnet phosphor and a silicate phosphor.

4. A wavelength converting system comprising:
   a first excitation wavelength emitted from a first light emitter;
   a first emission wavelength greater than the first excitation wavelength;
   a second excitation wavelength emitted from a second light emitter; and
   a second emission wavelength greater than the second excitation wavelength;
   wherein each of the first excitation wavelength, the first emission wavelength, the second excitation wavelength, and the second emission wavelength has chromaticity coordinates locating on a perimeter of a CIE chromaticity diagram, and a first line connects the first excitation wavelength and the first emission wavelength, a second line connects the second excitation wavelength and the second emission wavelength wherein the first line and the second line intersects in a region of the CIE chromaticity diagram.

5. The wavelength converting system of claim 4, wherein the first excitation wavelength and the second excitation wavelength are respectively in a range of 200 nm.about.530 nm, and the first emission wavelength and the second emission wavelength are respectively in a range of 480 nm.about.700 nm.

6. The wavelength converting system of claim 4, wherein the first line and the second line intersect in a white light region in the CIE chromaticity diagram.

7. The wavelength converting system of claim 4, wherein the first light emitter and the second light emitter are made of a material comprising nitrogen.

8. The wavelength converting system of claim 4, further comprising a wavelength converter to convert the first excitation wavelength and the second excitation wavelength to the first emission wavelength and the second emission wavelength respectively.

9. The wavelength converting system of claim 8, wherein the wavelength converter comprises an yttrium aluminum garnet phosphor and a silicate phosphor.

10. A wavelength converting system comprising:
    a radiation source;
    a first fluorescent material capable of being excited by the radiation source in a wavelength spectrum having a short wavelength and a long wavelength; and
    a second fluorescent material capable of being excited by the radiation source in the wavelength spectrum;
    wherein the first fluorescent material has a higher excitation efficiency than the second fluorescent material when being excited by the short wavelength, and a lower excitation efficiency than the second fluorescent material when being excited by the long wavelength.

11. The wavelength converting system of claim 10, wherein the radiation source radiates in a wavelength range of 200 nm.about.530 nm.

12. The wavelength converting system of claim 10, wherein the radiation source comprises a nitride based optoelectronic semiconductor device.

13. The wavelength converting system of claim 10, wherein one of the first fluorescent material and the second fluorescent material comprises a silicate phosphor or an yttrium aluminum garnet phosphor.

14. A wavelength converting system comprising:
    at least two light sources having a wavelength difference not less than 1 nm and not greater than 20 nm; and
    a wavelength converter on light paths of the at least two light sources and capable of being excited by one of the at least two light sources to provide a first mixed light having a first color temperature and by another one to provide a second mixed light having a second color temperature,
    wherein a difference between the first and second color temperatures is not greater than 100K.

15. The wavelength converting system of claim 14, wherein at least one of the light sources comprises a light-emitting diode.

16. The wavelength converting system of claim 14, wherein the light sources radiate light in a wavelength range of 200 nm.about.530 nm.

17. A wavelength converting system comprising:
    a light-emitting semiconductor structure comprising an electron provider, a hole provider, a light-emitting layer between the electron provider and the hole provider, and a light extraction interface; and
    a wavelength converter on the light extraction interface and providing an output light in response to an excitation of an input light;
    wherein the input light has an input light wavelength, the output light has an output light dominant wavelength, and the input light wavelength and the output light dominant wavelength have a positive correlation.

18. The wavelength converting system of claim 17, wherein the light-emitting semiconductor structure is made of a material comprising nitrogen.

19. A wavelength converting system comprising:
    a light-emitting source selected from any one of applicable light-emitting diode units from a wafer, wherein the light emitting source comprises a light extraction interface, the applicable light-emitting diode units have a wavelength distribution ranged in few nanometers or tens of nanometer; and
    a wavelength converter on the light extraction interface and providing an output light in response to an input light from the light-emitting source;
    wherein a mixed color light is generated by the presence of the input light and the output light.

20. The wavelength converting system of claim 19, wherein the light-emitting diode unit comprises a nitride-based light-emitting diode.

21. The wavelength converting system of claim 19, wherein the applicable light-emitting diode unit is introduced into the wavelength converting system without binning and sorting.

* * * * *